Jan. 12, 1960 L. J. GIACOLETTO 2,921,205

SEMICONDUCTOR DEVICES WITH UNIPOLAR GATE ELECTRODE

Filed July 29, 1954

INVENTOR.
LAWRENCE J. GIACOLETTO
BY J. L. Whittaker
ATTORNEY 2,921,205

SEMICONDUCTOR DEVICES WITH UNIPOLAR GATE ELECTRODE

Lawrence J. Giacoletto, Princeton Junction, N.J., assignor to Radio Corporation of America, a corporation of Delaware Application July 29, 1954, Serial No. 446,492

4 Claims. (Cl. 307—88.5)

This invention relates to semiconductor apparatus and particularly to semiconductor devices suitable for performing comparatively complex operations such as signal mixing or the like.

One general type of semiconductor device to which the principles of the invention apply is known as a transistor, one conventional type of which comprises a body of semiconductor material having two rectifying electrodes in contact therewith. The rectifying electrodes may be surface barrier electrodes of the small area variety such as point or line contacts. The rectifying electrodes may also be surface barrier electrodes of comparatively large area for example, plates or films in rectifying contact with the surface of the crystal or they may be P–N junction electrodes. In such types of transistors one rectifying electrode is operated as an input or emitter electrode and injects minority charge carriers into the crystal. The minority charge carriers are collected by the other rectifying electrode which is termed the output or collector electrode. A base electrode is in ohmic (non-rectifying) contact with the crystal and, by determining the electrical potential of the crystal, serves to control the emitter-to-collector current flow.

One characteristic of transistors of the above-described types having emitter, collector and base electrodes is that, when the device is used as an amplifier or the like, an input signal may be applied either to the emitter electrode or to the base electrode. However, such a device is not suitable for operation with more than one signal input and, thus, it is not suitable for performing complex operations such as signal mixing.

Accordingly, an important object of this invention is to provide semiconductor apparatus of new and improved form.

Another object of the invention is to provide an improved semiconductor apparatus having a novel control mechanism.

A further object of the invention is to provide improved semiconductor apparatus for performing comparatively complex electrical operations.

Another object of the invention is to provide an improved multi-electrode semiconductor device suitable for providing signal mixing operation.

In general, the purposes and objects of this invention are accomplished by the provision of a transistor including a body of semiconductor material having emitter and collector rectifying electrodes in contact therewith and including, in addition, rectifying control electrode means in contact with the emitter and/or collector electrodes.

Typical transistor emitter-to-collector current flow is achieved under the influence of a first signal applied, for example, to the base element of the transistor; a second signal applied to the control electrode provides a type of unipolar gate control action and modulates the conductance of a portion of the transistor. To provide the desired action, the control electrode is biased in the reverse direction with respect to the electrode it contacts, for example the emitter electrode, whereby the space charge barrier associated with the control electrode penetrates into the emitter electrode and thereby constricts the current flow path therethrough. The current flow through the emitter, and the transistor, is similarly restricted. In addition, a control signal applied to the control electrode modulates the penetration of the space charge barrier and modulates the current flow through the emitter electrode and through the transistor.

The invention is described in greater detail by reference to the drawing wherein.

Similar elements are designated by similar reference characters throughout the drawing.

Figures 1, 2:
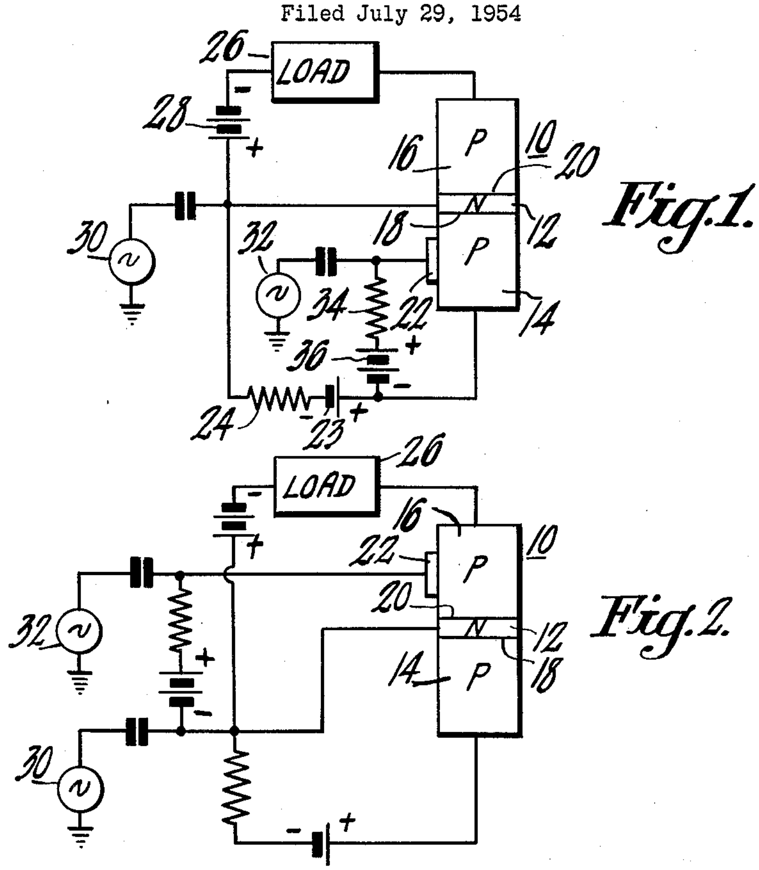
Fig. 1 is an elevational view of a device embodying the principles of the invention and a schematic representation of a circuit in which it may be operated.
Fig. 2 is an elevational view of a first modification of the device of Fig. 1 and a schematic representation of a circuit with which it may be employed.

Referring to Figure 1, a device 10 embodying the principles of the invention includes a body of semiconductor material, for example, germanium, silicon or the like which includes a base region 12 of N-type or P-type conductivity. In the following description the body will be assumed to be germanium and the base region 12 will be assumed to be N-type germanium. The base region 12 has regions 14 and 16 of P-type material in rectifying contact therewith and separated therefrom by rectifying barriers 18 and 20 respectively. The region 14 comprises the emitter region or electrode of the device 10 and the region 16 comprises the collector region or electrode of the device 10. In the optimum construction the base region 12 is considerably thinner than the emitter and collector regions.

According to the invention, a gate control electrode 22 is provided in rectifying contact with the emitter region 14 and adjacent to the current flow path through the emitter. Electrode 22 may be a surface barrier rectifying electrode or it may be a P–N junction electrode formed by a crystal growing method or by an alloying method such as that described in an article by Law et al. entitled "A Developmental P–N–P Junction Transistor" in the Proceedings of the I.R.E. of November 1952. The effectiveness and the efficiency of the control electrode varies with its area. The larger the area of electrode 22 and the greater the surface of the emitter region 14 encompassed thereby, the more effective the control action. Thus, to increase its area, the control electrode may comprise a plurality of electrode elements or it may be formed as a ring surrounding the entire periphery of the emitter zone.

In the above-described device 10, the collector region 16, which is the collector electrode of the device, may be replaced by a surface barrier electrode in the form of a point, plate, film or the like or it may be a P–N junction electrode formed by an alloying or fusion process.

Since the emitter region 14 is necessarily of considerable length to accommodate the control electrode 22, the emitter region is preferably formed by a crystal growing process.

The device 10 of the invention may be operated in a circuit in which the emitter region 14 is connected to the positive terminal of a battery 23, the negative terminal of which is connected through a current limiting resistor 24 to the base region 12. The emitter region is thus biased in the forward direction with respect to the base region 12. The collector region 16 in turn is connected through a suitable load circuit 26 to the negative terminal of a battery 28, the positive terminal of which is connected to the base region 12. The collector is thus biased in the reverse direction with respect to the base 12. A suitable signal source 30 is connected to the base region to provide base signal input to the transistor. The control electrode 22 is connected through a current limiting resistor 34 to the positive terminal of a battery 36, the negative terminal of which is connected to the emitter zone 14. The control electrode 22 is thus biased in the reverse direction with respect to the emitter region 14. A second signal source 32 is coupled to the control electrode 22.

In operation of the device 10, current flows between the emitter 14 and collector 16 under the influence of the signal applied to the base 12 by the first signal source 30. This current flow is controlled or modulated by the gate control electrode 22 under the influence of a signal from the second signal source 32. Since the control electrode is biased in the reverse direction with respect to the emitter 14 the space charge region associated therewith penetrates into the crystal and constricts the current flow path through the emitter region, thus restricting current flow through the emitter. The signal applied to the control electrode from the source 32 modulates the penetration of the space charge barrier and the emitter current flow and thus exerts the desired control action. The net result of this mode of operation is mixing of the signals from the sources 30 and 32. Thus, the electrode provides a type of unipolar gate control action.

If desired, the device 10 may be operated with emitter input rather than base input, that is with the input signal applied directly to the emitter 14 as is well known in the art.

A device which provides the foregoing type of operation may be employed in many types of circuits, for example in automatic gain control circuits, in computers, and the like.

If desired, the control electrode 22 may be provided in contact with the collector region 14 as shown in Figure 2 and either a base input or emitter input circuit arrangement may be employed.

Figure 3:
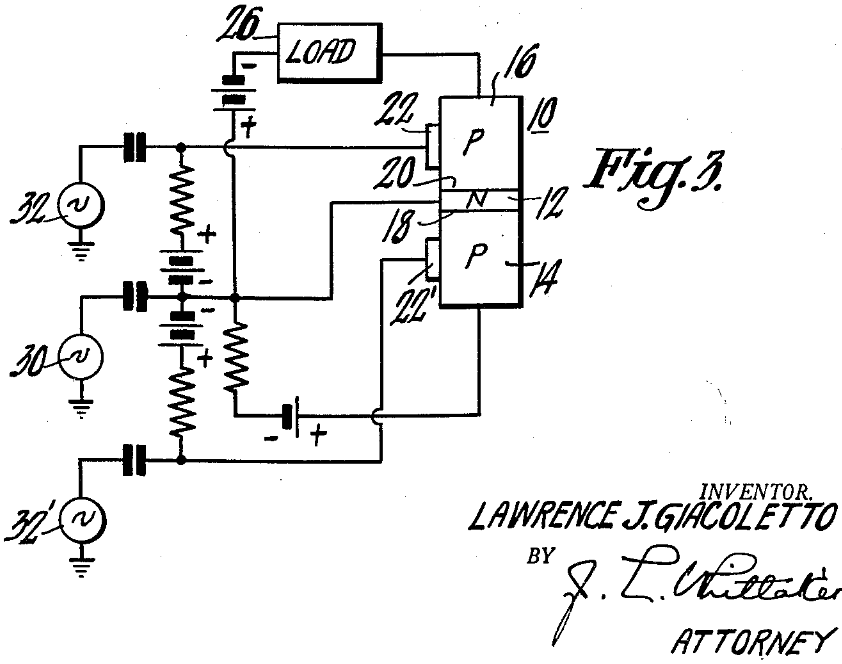
Fig. 3 is an elevational view of a second modification of the device of Fig. 1 and a schematic representation of a circuit with which it may be employed.

Referring to Figure 3, as a further modification of the invention the control electrode 22 is provided in rectifying contact with the collector region 16 and an auxiliary control electrode 22' is provided in contact with the emitter region 14. Separate control signal sources 32 and 32' may be impressed upon the electrodes 22 and 22', respectively.

What is claimed is:

1. A bipolar transistor comprising a semiconductor body having emitter, base, and collector regions, an emitter junction separating said emitter and base regions, an emitter electrode in contact with said emitter region, said emitter junction and said emitter electrode defining the ends of an emitter current path through said emitter region, a collector junction separating said collector and base regions, a collector electrode in contact with said collector region, said collector junction and said collector electrode defining the ends of a collector current path through said collector region, a broad area unipolar gate electrode adjacent at least one of the emitter current path and the collector current path for modulating the current in said path, the thickness of the region under said unipolar gate electrode being less than the thickness of the depletion layer associated with said gate electrode at Zener breakdown, and means for biasing said unipolar gate electrode in the reverse direction connected to said unipolar gate electrode.

2. The transistor of claim 1 wherein a unipolar gate electrode is adjacent the emitter current path.

3. The transistor of claim 1 wherein a unipolar gate electrode is adjacent the collector current path.

4. The transistor of claim 1 wherein a unipolar gate electrode is adjacent the path of both the emitter current and the collector current.

References Cited in the file of this patent

UNITED STATES PATENTS

| | | |
|---|---|---|
| 2,655,610 | Ebers | Oct. 13, 1953 |
| 2,676,271 | Baldwin | Apr. 20, 1954 |
| 2,709,787 | Kircher | May 31, 1955 |
| 2,754,431 | Johnson | July 10, 1956 |
| 2,756,285 | Shockley | July 24, 1956 |